United States Patent [19]

Ramet et al.

[11] 4,080,512
[45] Mar. 21, 1978

[54] SUBSTRATE FOR INTEGRATED CIRCUIT

[75] Inventors: Gilbert Ramet, Cheseaux-Noreaz; Pierre-André Maire, Bevaix, Switzerland

[73] Assignee: Ebauches S.A., Neuchatel, Switzerland

[21] Appl. No.: 691,242

[22] Filed: Jun. 1, 1976

[30] Foreign Application Priority Data

Jun. 5, 1975 Switzerland ............... 7437/75

[51] Int. Cl.² ............................................. H05K 1/00
[52] U.S. Cl. .................................... 174/68.5; 361/397
[58] Field of Search ................ 174/68.5; 29/625, 626; 317/101 B, 101 C

[56] References Cited

U.S. PATENT DOCUMENTS

| 3,471,753 | 10/1969 | Burks et al. | 174/68.5 X |
| 3,628,095 | 12/1971 | Schwartz et al. | 174/68.5 X |

Primary Examiner—Aruthr T. Grimley
Attorney, Agent, or Firm—St. Onge, Mayers, Steward & Reens

[57] ABSTRACT

A substrate for integrated circuits which can be used for mounting different types of circuits indiscriminately by providing three kinds of conductive tracks, one for connection to one type of circuit, a second to another type of circuit and a third to either or both of such circuits. Each kind of conductive track is provided with a distinctive marking which indicates whether it can be connected to only one or the other of the circuits, or whether it can be connected to either one.

2 Claims, 1 Drawing Figure

4,080,512

SUBSTRATE FOR INTEGRATED CIRCUIT

BACKGROUND OF THE INVENTION

The present invention relates to a substrate for integrated circuits.

For the realization of electronic circuits, one has to use a substrate, generally constituted by a ceramic plate, on which are secured several components of the circuit, i.e. one or several integrated circuits and discrete elements such as resistances, capacitances, and others. Such substrate are provided with conductive tracks to which are connected, by conductive connecting means, the terminals or leads of the several elements of the circuit secured to the substrate.

So far as the integrated circuits are concerned, it can happen that circuits which provide like functions have different shapes, especially so far as the arrangement of their leads is concerned, depending on their origin, or in other words on whether they are made by one manufacturer or another. It has consequently been necessary either to have several different substrates, corresponding to the different types of integrated circuits which can be used, or to make connections between the leads of the integrated circuits and conductive tracks of the substrate which are not directly opposite to each other. In either case the disadvantages are obvious.

The object of the present invention is to furnish a substrate permitting integrated circuits of two different types to be indiscriminately mounted on it at the place intended to receive an integrated circuit, or at each of these places if the substrate is intended to receive several integrated circuits.

SUMMARY OF THE INVENTION

To this end, the substrate according to the invention is characterized by the fact that it is provided with first conductive tracks intended to be connected to the leads of an integrated circuit, with second conductive tracks intended to be connected to the leads of another integrated circuit, the arrangement and/or the connection of the other circuit being different from the first one, and with third conductive tracks intended to be connected to one or both of said circuits in order to permit the use of the said substrate for either of the said circuits; the said conductive tracks being provided with distinctive signs indicating that they are usable for the first-named circuit only, for the other circuit only, or for both circuits. Such marking facilitates the mounting of either of the said circuits on the substrate, i.e. the connection of each lead of one of the circuits with the corresponding conductive track of the substrate. It also facilitates checking the operation once the circuit is secured to the substrate.

DETAILED DESCRIPTION OF PREFERRED EMBODIMENT

Figure 1:
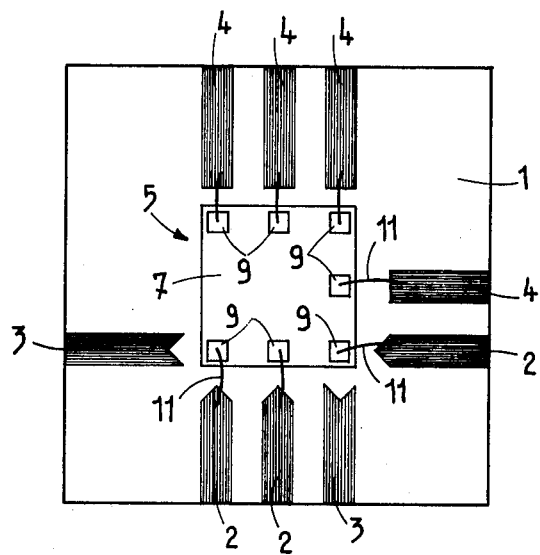

The drawing shows, by way of example, one embodiment of the invention.

Figure 2:
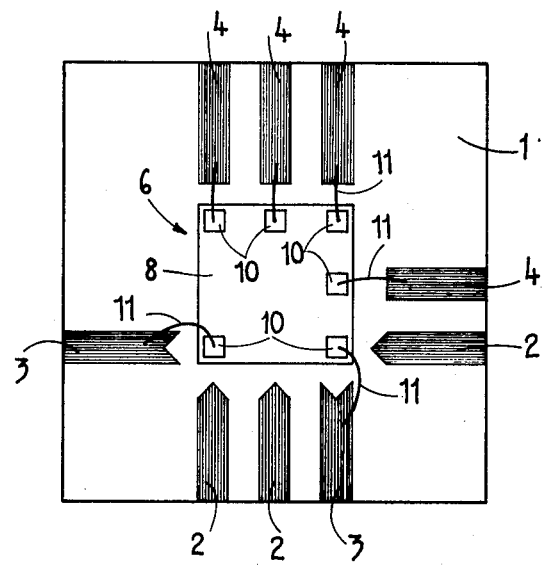

FIG. 1 is a plan view of a substrate for an integrated circuit provided with a circuit of a first type, and FIG. 2 is a plan view of the same substrate provided with an integrated circuit of a different type.

The substrate represented is constituted by a square plate 1, of ceramic, provided with nine conductive tracks, of three different types, designated respectively by 2, 3 and 4. These tracks distinguish one from the other by the configuration of their inner end, which has the shape of a protruding V for the tracks 2 and of a recessed V for the tracks 3, the tracks 4 being straight at the inner end. These tracks are arranged parallel to the sides of the square constituting the substrate 1, the open area which is provided between them being intended to receive an integrated circuit such as the circuit 5 of FIG. 1 or the circuit 6 of FIG. 2.

These integrated circuits are constituted by a small plate of silicium, designated by 7, in the case of the circuit 5, and designated by 8 in the case of the circuit 6, which are suitably attached to the substrate and which are provided with output terminals diesignated by 9 in the case of the circuit 5 and by 10 in the case of the circuit 6. The conductive tracks of the substrate are arranged in such a way that some of them (i.e. the tracks 2) are intended to be connected only to the terminals 9 of the circuit 5, that others (i.e. the tracks 3) are intended to be connected only to the terminals 10 of the circuit 6, while still others (i.e. tracks 4) are intended to be connected either to the terminals 9 of the circuit 5 or to the terminals 10 of the circuit 6, or both.

It follows from this arrangement that the circuits 5 and 6 can be mounted indiscriminately on the substrate 1 and that, in either case the outputs of the circuits are connected by connecting conductive elements 11 to tracks which are situated directly in their neighborhood.

In the example represented, the two integrated circuits 5 and 6 differ from each other by their configuration. On the other hand, they could also be identical in their appearance, but have terminals which differ in purpose. In the latter case the present substrate would still be suitable for indiscriminately receiving different types of integrated circuits.

The different appearance of the ends of the conductive tracks facilitates not only the mounting of the integrated circuits, but also the checking of the electronic circuit terminated, constituted by the substrate provided with the integrated circuit and with its other components.

As a matter of fact, it is to be noted that, in the present example, the substrate has been represented as being intended to receive only one integrated circuit while, in the practice, the substrates are intended to receive, in addition to one or several integrated circuits, discrete elements such as resistances, capacitances or other elements. In the case where the substrate is intended to receive several integrated circuits, each place intended to receive such a circuit, or at least one of them, will then be arranged in such a way that integrated circuits of two different types can be mounted thereon indiscriminately.

We claim:

1. A substrate for integrated circuits having
   first conductive tracks for connection to the terminals of an integrated circuit;
   second conductive tracks for connection to the terminals of another integrated circuit, the leads of said other circuit being different from said first-named circuit;
   third conductive tracks for connection to either of said circuits;
   such that said substrate can be used for either of said circuits;
   said first conductive tracks being provided with a distinctive sign indicating that they can be connected only to one of said circuits;

said second conductive tracks being provided with a distinctive sign indicating that they can be connected only to the other of said circuits; and said third conductive tracks being provided with a distinctive sign indicating that they can be connected to either of said circuits;

thereby facilitating the mounting of any of said circuits on said substrate and the checking operation once said circuit is assembled on said substrate.

2. A substrate as defined in claim 1, wherein said distinctive signs for said conductive tracks comprise different configurations at the end of each type of track.

* * * * *